United States Patent
Kouchi et al.

(10) Patent No.: US 7,349,281 B2
(45) Date of Patent: Mar. 25, 2008

(54) ANTI-FUSE MEMORY CIRCUIT

(75) Inventors: Toshiyuki Kouchi, Kawasaki (JP); Shigeyuki Hayakawa, Yokosuka (JP)

(73) Assignee: Kabushiki Kaisha Toshiba, Minato-ku, Tokyo (JP)

( * ) Notice: Subject to any disclaimer, the term of this patent is extended or adjusted under 35 U.S.C. 154(b) by 36 days.

(21) Appl. No.: 11/516,683

(22) Filed: Sep. 7, 2006

(65) Prior Publication Data
US 2007/0058473 A1 Mar. 15, 2007

(30) Foreign Application Priority Data
Sep. 9, 2005 (JP) ............................. 2005-262642

(51) Int. Cl.
*G11C 17/18* (2006.01)
(52) U.S. Cl. ................................ 365/225.7; 365/189.01
(58) Field of Classification Search ............. 365/225.7, 365/189.01, 189.08
See application file for complete search history.

(56) References Cited

U.S. PATENT DOCUMENTS

| | | | |
|---|---|---|---|
| 5,838,625 A | 11/1998 | Cutter et al. | |
| 6,630,724 B1 | 10/2003 | Marr | |
| 6,671,040 B2 | 12/2003 | Tong et al. | |
| 7,102,951 B2 * | 9/2006 | Paillet et al. ............. | 365/225.7 |
| 7,149,114 B2 * | 12/2006 | Taheri et al. ........... | 365/185.08 |

FOREIGN PATENT DOCUMENTS

JP 2004-022736 1/2004

* cited by examiner

*Primary Examiner*—Son Dinh
(74) *Attorney, Agent, or Firm*—Banner & Witcoff, Ltd.

(57) ABSTRACT

First and second anti-fuse elements are provided for storing 1-bit data. A program voltage generating circuit generates a programming voltage and applies it to the first and second anti-fuse elements. A read voltage generating circuit generates a readout voltage and applies it to the first and second anti-fuse elements. First and second transistors are inserted between the first and second anti-fuse elements and a ground potential node, and are respectively turned on by first and second select signals during the programming period. A switch element is connected between the first and the second transistors. The switch element is turned off during the programming period, and turned on during the readout period. A sense amplifier is connected to the switch element in order to sense the data read out from the first and the second anti-fuse elements.

20 Claims, 7 Drawing Sheets

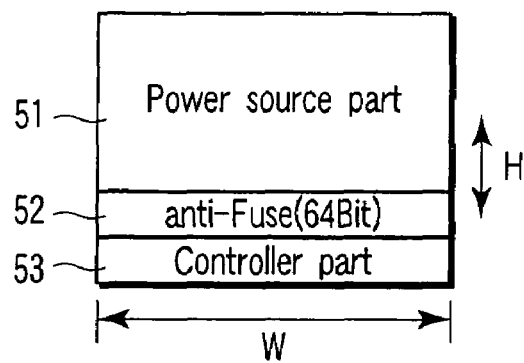
F I G. 6A
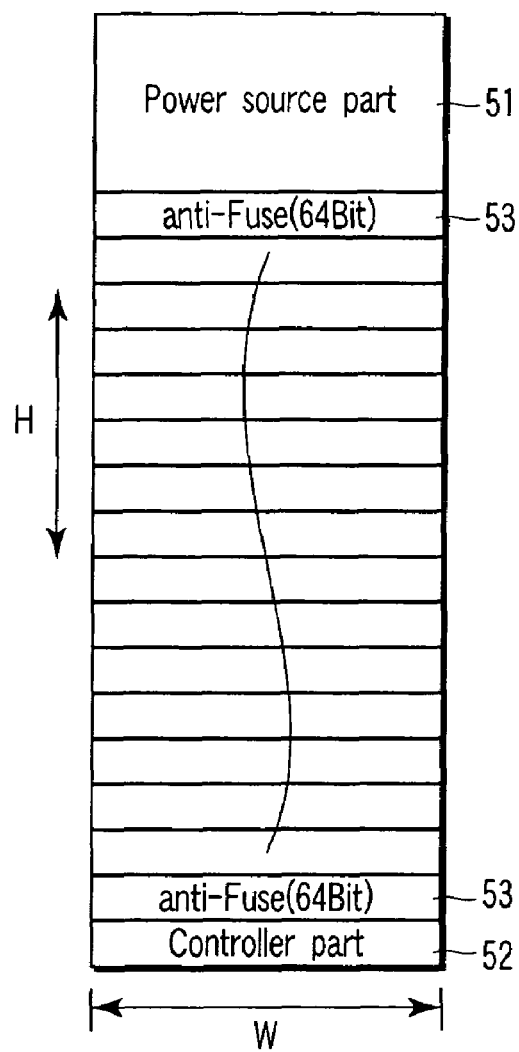
F I G. 6B

ANTI-FUSE MEMORY CIRCUIT

CROSS-REFERENCE TO RELATED APPLICATIONS

This application is based upon and claims the benefit of priority from prior Japanese Patent Application No. 2005-262642, filed Sep. 9, 2005, the entire contents of which are incorporated herein by reference.

BACKGROUND OF THE INVENTION

1. Field of the Invention

The present invention relates to an anti-fuse memory circuit in which data of "0" and "1" are programmed in an anti-fuse element. The invention is applied to a memory circuit for storing information to identify semiconductor chips or defect address information of a memory redundancy circuit.

2. Description of the Related Art

In a conventional memory circuit using the anti-fuse, one anti-fuse element is used for storing data of 1 bit. An amount of current flowing through the anti-fuse element after it is destroyed depends on a destructive state of the element and process conditions. For this reason, even if the anti-fuse element is satisfactorily destroyed, a width of a distribution of the amount of current flowing through the destroyed element is wide. In this case, no problem arises if the center of the current amount distribution of the current flowing through the destroyed element is greatly distanced from that of the current amount distribution when the element is in a non-destructive state, viz., when little current flows therethrough. Actually, however, a difference between the amount of current flowing through the destroyed anti-fuse element and that of current flowing through the anti-fuse element not destroyed is insufficiently large. Sometimes, the current amount of the anti-fuse element being in a destructive state is equal to that in a nondestructive state. In such a case, it is impossible to normally distinguish between a destructive state and a nondestructive state, viz., "1" and "0".

Jpn. Pat. Appln. KOKAI Publication No. 2004-22736 discloses a technology to realize a circuit realizing the writing function and the data detecting function of the anti-fuse element by using a small number of elements.

BRIEF SUMMARY OF THE INVENTION

According to one aspect of the present invention, there is provided an anti-fuse memory circuit including: first and second anti-fuse elements each having first and second ends, the first ends thereof being interconnected; a program voltage generating circuit which generates a programming voltage during a programming period to program the first and second anti-fuse elements, and applies the programming voltage to a common connection node of the first ends of the first and second anti-fuse elements; a read voltage generating circuit which generates a readout voltage during a readout period to read out data from the first and second anti-fuse elements, and applies the readout voltage to the common connection node of the first ends of the first and second anti-fuse elements; a first transistor being turned on by a first select signal during the programming period, a current path of the first transistor being connected to between the second end of the first anti-fuse element and a reference potential node; a second transistor having a current path thereof being connected to between the second end of the second anti-fuse element and the reference potential node, the second transistor being turned on by a second select signal during the programming period; a switch element which is connected to the first ends of the first and second transistors being interconnected, the switch element being put in an off state during the programming period and in an off state during the readout period; and a sense amplifier which is connected at an input terminal to the first end of the switch element, the sense amplifier being sensed data read out from the first and second anti-fuse elements.

BRIEF DESCRIPTION OF THE SEVERAL VIEWS OF THE DRAWING

FIG. 6A is a plan view showing a layout of the anti-fuse memory circuit of the first embodiment;

FIG. 6B is a plan view showing another layout of the anti-fuse memory circuit of the first embodiment;

DETAILED DESCRIPTION OF THE INVENTION

Embodiments of the present invention will be described in detail with reference to the accompanying drawings. Throughout the drawings, like and equivalent portions are designated by like reference symbols.

FIRST EMBODIMENT

Figure 1:
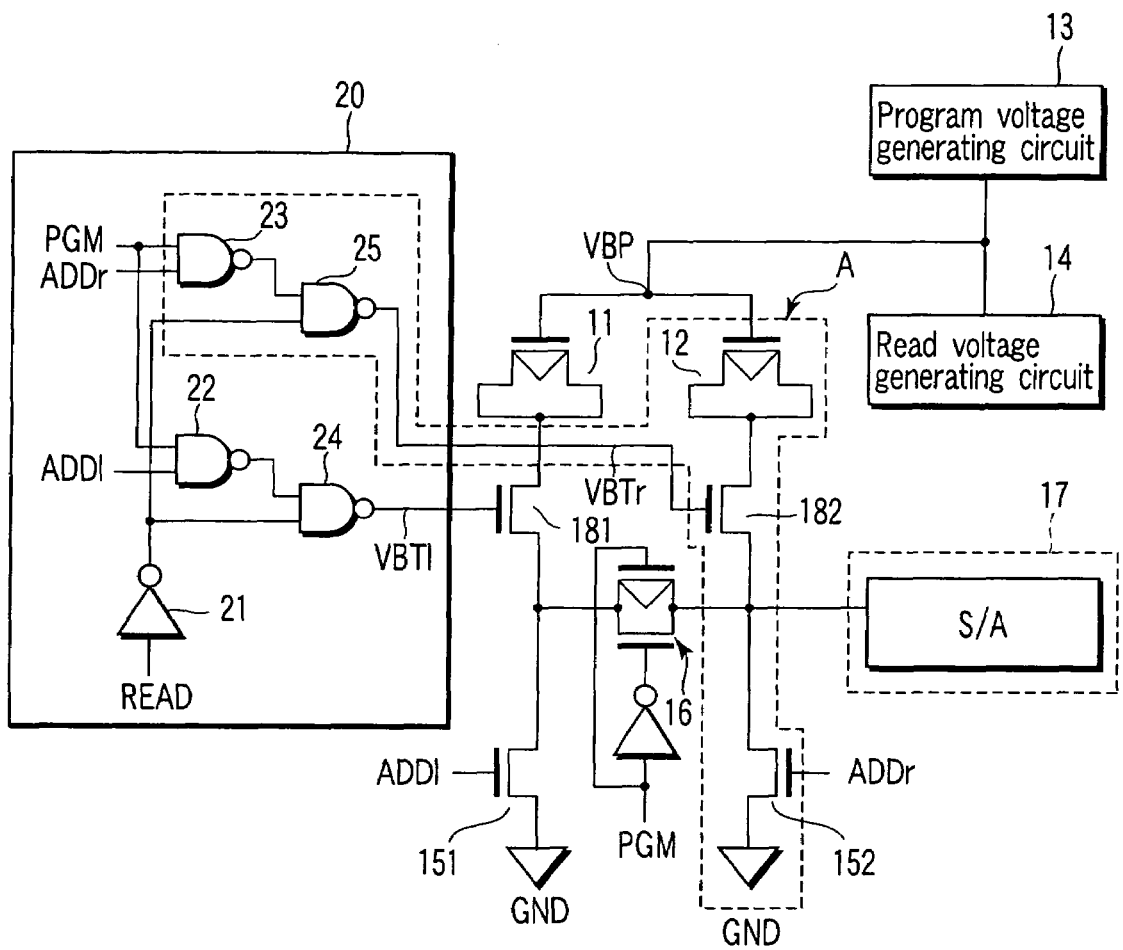
FIG. 1 is a circuit diagram showing an anti-fuse memory circuit according to a first embodiment of the present invention.

FIG. 1 shows an anti-fuse memory circuit according to a first embodiment of the present invention. The anti-fuse memory circuit is provided in a semiconductor integrated circuit device. In the anti-fuse memory circuit, a plurality of anti-fuse elements, for example, two anti-fuse elements in this instance, are used for storing data of 1 bit. The two anti-fuse elements are a first anti-fuse element 11 and a second anti-fuse element 12. Each anti-fuse element is formed with, for example, a PMOS transistor in which a source and a drain are shortcircuited. Data is programmed in each anti-fuse element in a manner that the gate oxide of the element is put in a non-destructive state, i.e., the gate-source path thereof is put in a high resistance state, or the gate oxide is put in a destructive state, i.e., the gate-source path is put in a low resistance state. The first and the second anti-fuse elements 11 and 12 are interconnected at the first ends, for example, the gates. A node VBP of a gate common connection point is connected to an output terminal of a program voltage generating circuit 13 and an output terminal of a read voltage generating circuit 14. The program voltage generating circuit 13 generates a program voltage during the program periods of the first and the second anti-fuse elements 11 and 12. The read voltage generating circuit 14 generates a readout voltage during the data readout periods of the first and the second anti-fuse elements 11 and 12.

A source-drain current path of a first NMOS transistor 151 for program select, which is turned on by a first select signal ADDl during the program period, is connected to between the second end of the first anti-fuse element 11, i.e., the source-drain connection node, and the ground potential node (GND). A source-drain current path of a second NMOS transistor 152 for program select, which is turned on by a second select signal ADDr during the program period, is connected to between the second end of the second anti-fuse element 12, i.e., the source-drain connection node, and the ground potential node.

A CMOS transfer gate 16 for switch, which is turned off during the programming period and turned on during the readout period by a program mode signal PGM, is connected to between the drains of the first and the second NMOS transistors 151 and 152. An input terminal of a sense amplifier 17 as a sensing circuit for sensing data stored in the first and the second anti-fuse elements 11 and 12 is connected to a node of the first end of the CMOS transfer gate 16, for example, the drain of the second NMOS transistor 152. The sense amplifier 17 compares a potential at the node of the first end of the CMOS transfer gate 16 with, for example, a reference potential to thereby sense data of "0" and "1" programmed in the first and the second anti-fuse elements 11 and 12.

When a programming voltage that is generated by the program voltage generating circuit 13 during the programming period is sufficiently higher than a readout voltage generated by the read voltage generating circuit 14 during the readout period, for example, when the programming voltage is 8 V and the readout voltage is 2.5 V, it is desirable to suppress the voltage that is applied to the drains of the first and the second NMOS transistors 151 and 152 for program select during the programming period. To this end, in the instant embodiment, a drain-source current path of a third NMOS transistor 181 for barrier is inserted between the second end of the first anti-fuse element 11 and the first NMOS transistor 151, and a drain-source current path of a fourth NMOS transistor 182 for barrier is inserted between the second end of the second anti-fuse element 12 and the drain of the second NMOS transistor 152. The third NMOS transistor 181 is turned on by an output signal VBTl of a drive circuit 20 during the programming period of the first anti-fuse element 11. The fourth NMOS transistor 182 is turned on by an output signal VBTr of the drive circuit 20 during the programming period of the second anti-fuse element 12. During the readout period for reading out data from the first and the second anti-fuse elements 11 and 12, the third and fourth NMOS transistors 181 and 182 are both turned on by the output signals VBTl and VBTr from the drive circuit 20.

The drive circuit 20 receives a program mode signal PGM, a readout mode signal READ, a first select signal ADDl and a second select signal ADDr, and outputs the output signal VBTl and the output signal VBTr. More exactly, the drive circuit 20 includes an inverter circuit 21 for inverting the readout mode signal READ, a first NAND circuit 22 which receives the program mode signal PGM and the first select signal ADDl, a second NAND circuit 23 which receives the program mode signal PGM and the second select signal ADDr, a third NAND circuit 24 which receives output signals of the first NAND circuit 22 and the inverter circuit 21, and outputs the output signal VBTl, and a fourth NAND circuit 25 which receives output signals of the second NAND circuit 23 and the inverter circuit 21, and outputs the output signal VBTr.

Figure 2:
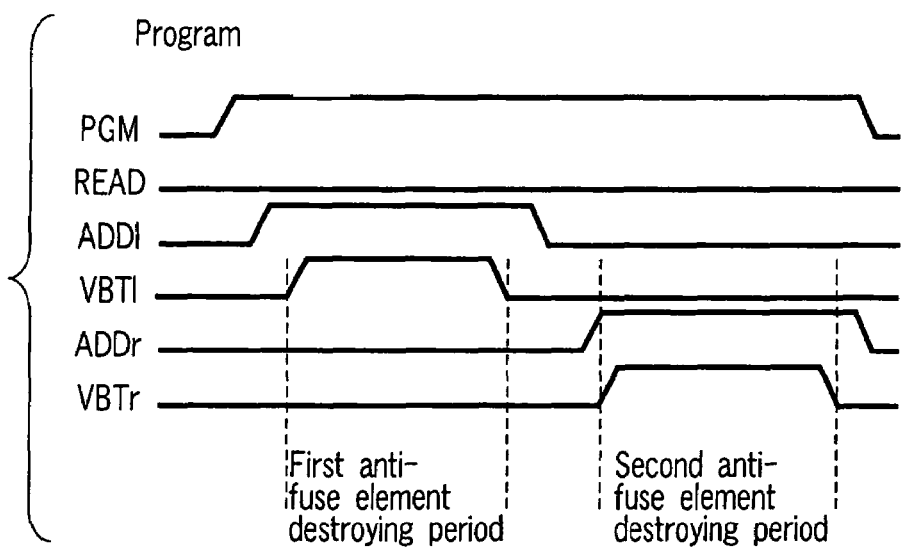
FIG. 2 is a waveform diagram showing an operation of the anti-fuse element in FIG. 1 during a programming period.
Figure 3:
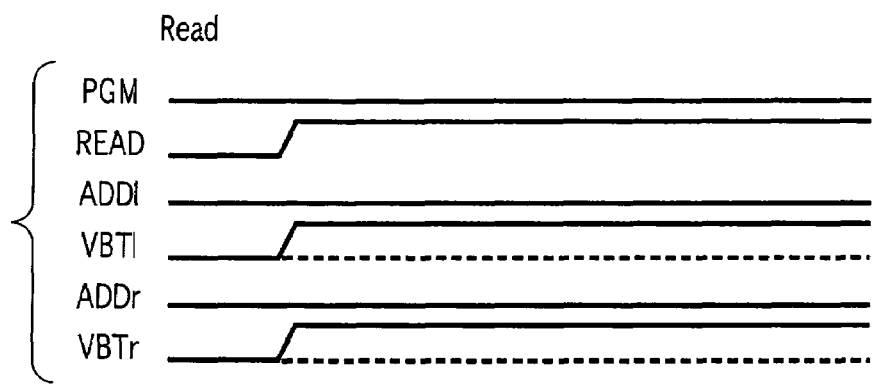
FIG. 3 is a waveform diagram showing an operation of the anti-fuse element in FIG. 1 during a read-out period.

FIG. 2 shows signal waveforms at key portions during the programming periods of the first and the second anti-fuse elements 11 and 12 in FIG. 1. FIG. 3 shows signal waveforms at key portions during the readout period when data is read out from the first and the second anti-fuse elements 11 and 12 in FIG. 1.

In the instant embodiment, two anti-fuse elements are used for storing data of one bit. Therefore, it is impossible to concurrently destroy two anti-fuse elements during the programming period to thereby set up a current flowing state (hereinafter referred to as a destructive state) in the elements. The reason for this is that if either of the anti-fuse elements is destructive, current flows into the anti-fuse element being in a destructive state, and no programming voltage is applied to the anti-fuse element being in a nondestructive state. Therefore, it is essential to electrically separate the two anti-fuse elements during the programming period.

As shown in FIG. 2, during the programming period, the program mode signal PGM is placed in an "H" level and the readout mode signal READ is placed in an "L" level. At this time, the CMOS transfer gate 16 for switch is put in an off state. Then, to select the first anti-fuse element 11, the first select signal ADDl is put in an "H" level. At this time, the second select signal ADDr is in an "L" level. When the first select signal ADDl goes high ("H" level), the output signal VBTl of the drive circuit 20 goes high and the output signal VBTr goes low ("L" level). Consequently, the third NMOS transistor 181 for barrier and the first NMOS transistor 151 for program select are turned on to be in an on state, and the fourth NMOS transistor 182 for barrier and the second NMOS transistor 152 for program select are turned off to be an off state. As a result, the first anti-fuse element 11 is programmed. Thus, when a programming voltage is generated by the program voltage generating circuit 13, the gate oxide of the first anti-fuse element 11 is destroyed. When it is not generated by the program voltage generating circuit 13, the gate oxide of the first anti-fuse element 11 is not destroyed.

Subsequently, to select the second anti-fuse element 12, the second select signal ADDr is put in an "H" level. At this time, the first select signal ADDl is in an "L" level. When the second select signal ADDr goes high ("H" level), the output signal VBTl of the drive circuit 20 goes low ("L" level), and the output signal VBTr of the drive circuit 20 goes high ("H" level). As a result, the third NMOS transistor 181 for barrier and the first NMOS transistor 151 for program select are in an off state, and the fourth NMOS transistor 182 for barrier and the second NMOS transistor 152 for program select are in an on state. Accordingly, the second anti-fuse element 12 is programmed.

In the anti-fuse memory circuit shown in FIG. 1, the two anti-fuse elements 11 and 12 are selected and destroyed during the programming period.

To read out data from the two anti-fuse elements 11 and 12, as shown in FIG. 3, the program mode signal PGM is placed in an "L" level, the readout mode signal READ is placed in an "H" level, and the first select signal ADDl and the second select signal ADDr are placed in an "L" level. In turn, the CMOS transfer gate 16 for switch is turned on, and the output signals VBT1 and VBT1 of the drive circuit 20 go high ("H" level). The two NMOS transistors 181 and 182 for barrier are both turned on, and the two NMOS transistors 151 and 152 program select are both turned off. The first ends of the two NMOS transistors 181 and 182 for barrier are shortcircuited. At this time, a readout voltage is generated by the read voltage generating circuit 14, and applied to the first ends of the two anti-fuse elements 11 and 12. Currents, which are dependent on the programming states of the two anti-fuse elements 11 and 12, flow to those anti-fuse elements. Potential at the common node of the first ends of the two NMOS transistors 181 and 182 is determined depending on the currents flowing through the two anti-fuse elements 11 and 12, and the potential at the node is sensed by the sense amplifier 17.

In a readout mode of the anti-fuse memory circuit of FIG. 1, sufficient readout currents are secured when the two anti-fuse elements are both in a destructive state since the two anti-fuse elements are used. Therefore, it is stably determined whether the anti-fuse elements are in a destructive state or nondestructive state, independently of the process variation and the current amount variation after the anti-fuse element destruction.

Even if current flows into both of the two anti-fuse elements when data is read out, the currents flowing through those elements are small, and increase of the current consumption by provision of the two anti-fuse elements is negligible. One bit of data is stored by using the two anti-fuse elements. The pattern area of the anti-fuse elements is small. Accordingly, an increase of the entire pattern area may be considered to be substantially equal to an increase of the drive circuit.

The anti-fuse element allowing current to flow therethrough after it is destroyed, which is used in the instant embodiment, is the anti-fuse element of the gate destroying type, which consists of the PMOS transistor in which the source and the drain are shortcircuited. It is evident that the anti-fuse element is not limited to the above-mentioned one. Examples of substitutive elements are a capacitor having a parallel plate structure and a capacitor of the type in which conductors are placed on the inner surfaces of trenches formed in the surface of a conductive semiconductor layer, with insulating films interposed therebetween. To cause dielectric breakdown in the anti-fuse elements having such structures, what a designer has to do is to apply voltage much higher than that in the case of the gate destroying type.

If the program voltage generating circuit 13 and the read voltage generating circuit 14 are incorporated into the semiconductor integrated circuit device as in the instant embodiment, the device can cope with even the case where the anti-fuse memory circuit is programmed in the stage of using the device.

(Voltage Separation in Power Source Circuit)

The output terminals of the program voltage generating circuit 13 and the read voltage generating circuit 14 are connected to the node VBP. The voltage of the former is separated from that of the latter in the following manner.

The program voltage generating circuit 13 generates high voltage for destroying the element, about 8.0 V, for example, by boosting a normal logic voltage of 2.5 V, for example. The read voltage generating circuit 14 generates voltage equal to the logic voltage or voltage lower than the logic voltage by reducing the logic voltage. A problem that comes up here is that voltages of different values possibly appear at the same node VBP. To avoid this, it is necessary to form a voltage separation circuit to prevent formation of a current path between the program voltage generating circuit 13 and the read voltage generating circuit 14.

Figure 4:
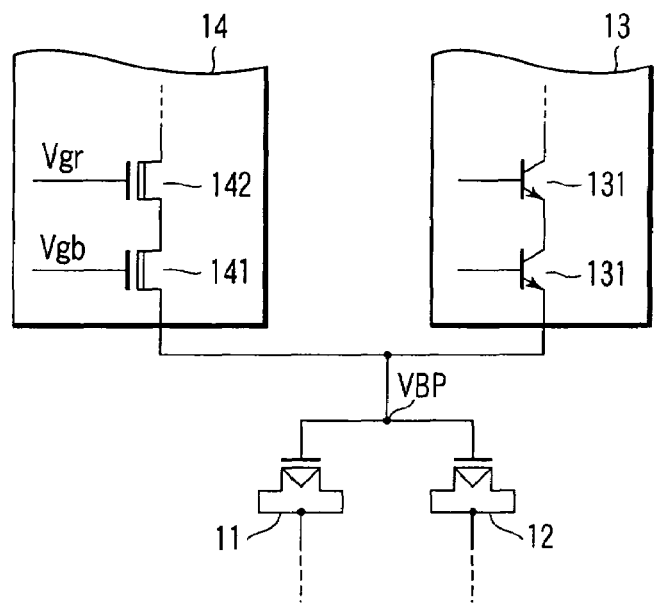
FIG. 4 is a circuit diagram showing a specific example of a voltage separation circuit for a program voltage generating circuit and a read voltage generating circuit in FIG. 1.

FIG. 4 shows a specific example of the voltage separation circuit for the program voltage generating circuit 13 and the read voltage generating circuit 14, which are shown in FIG. 1.

A charge pump circuit for voltage boosting, which contains bipolar transistors 131, is provided at the output part of the program voltage generating circuit 13. In the read voltage generating circuit 14, the logic voltage, e.g., 2.5 V is not directly used, but the logic voltage is reduced by utilizing the threshold voltage of the NMOS transistor. Specifically, in the output part of the read voltage generating circuit 14, a drain-source path of an MOS transistor 141 for electric field moderation and that of an MOS transistor 142 for readout voltage control are connected in series.

Operation of the voltage separation circuit in FIG. 4 will be described. When a destroying voltage of 8.0 V is applied to the node VBP at the time of anti-fuse destroying (programming), voltage stress is applied across the drain and the gate of the NMOS transistor 141 in the read voltage generating circuit 14. When voltage of 2.5 V as a gate voltage Vgb of the NMOS transistor 141 is applied to the gate, the voltage stress applied across the drain and the gate of the NMOS transistor 141 is 5.5 V (8.0 V–2.5 V=5.5 V). When voltage of "L" level is applied, as the gate voltage Vgr, to the gate of NMOS transistor 142, the read voltage generating circuit 14 is separated from its output terminal (voltage supply source of 2.5 V), and the destroying voltage of 8.0 V output from the program voltage generating circuit 13 is entirely applied to the anti-fuse elements 11 and 12.

When data is read out from the anti-fuse element, the program voltage generating circuit 13 ceases its operation, an "H" level voltage is applied as the gate voltage Vgb and the gate voltage Vgr to the NMOS transistor 141 and the NMOS transistor 142 in the read voltage generating circuit 14. As a result, a potential (about 1.8 V in this instance), lower than 2.5 V at the output terminal of the read voltage generating circuit 14 by a potential corresponding to a double of the threshold voltage of the NMOS transistor, appears at the node VBP. When the node VBP is at 1.8 V, the voltage having an opposite polarity is applied to the bipolar transistors 131 of the charge pump circuit of the output part of the program voltage generating circuit 13. Accordingly, no current flows in the reverse direction, and hence, voltage stress impressed on the charge pump circuit is small.

Figure 5:
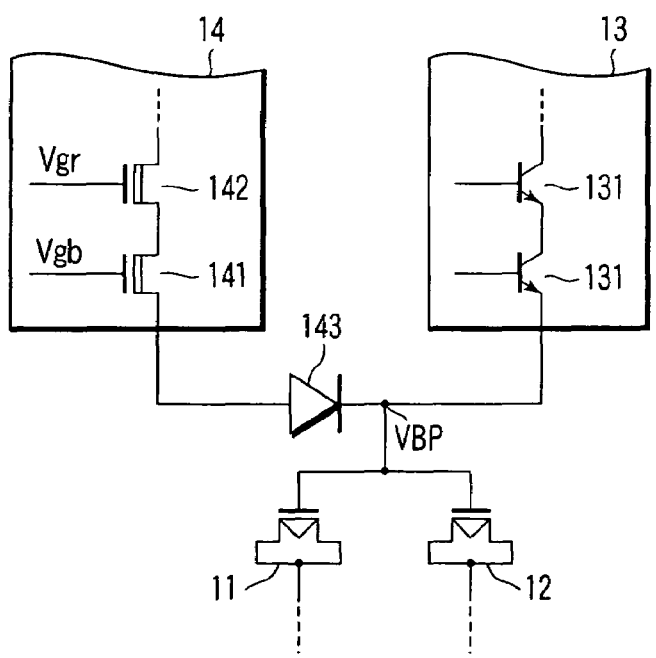
FIG. 5 is a circuit diagram showing another example of a voltage separation circuit for the program voltage generating circuit and the read voltage generating circuit in FIG. 1.

The voltage separation method applied to the output terminals of the program voltage generating circuit 13 and the read voltage generating circuit 14 is not limited to that shown in FIG. 4. In an alternative, as shown in FIG. 5, a diode element 143 is inserted in a reverse direction between the node VBP and the output terminal of the read voltage generating circuit 14. In this case, the breakdown voltage of the NMOS transistor 141 in the read voltage generating circuit 14 is increased. One of the measures to increase the breakdown voltage is to increase a thickness Tox of the gate oxide. By so doing, the breakdown voltage of the NMOS transistor 141 is increased, so that the gate voltage Vgb is increased.

The advantages in the case where more than two anti-fuse elements are used for storing 1-bit data as in the present embodiment will numerically be verified hereunder.

The semiconductor integrated circuit devices are uniformly manufactured, and hence, the physical size of the anti-fuse element presents no priority. Bear this in mind. The states of the anti-fuse elements destroyed by applying program voltage to those elements are not uniform, however.

Those states are different for each anti-fuse element. The spread of currents flowing through the destroyed anti-fuse elements is a normal distribution. This is based on the data gathered from actual devices. It is assumed that the mean current value of currents flowing through the destroyed anti-fuse elements is X (μA) and the standard deviation is σ (μA).

Let us consider the case where one anti-fuse element is used. In this case, the mean value and the standard deviation take the values just mentioned. A probability density function of the normal distribution is expressed below from the mean value X is

±1σ→(⅔) 68.3%
±2σ→(1/20) 95.4%
±3σ→(1/400) 99.7%

To distinctly distinguish between a state ("0") indicative of no current flowing and a state ("1") of current flowing, it is intended that −3σ is sufficiently distanced from the center of the normal distribution.

Let us consider an anti-fuse memory circuit where P (=integer of 2 or larger) anti-fuse elements are used.

When a P number of anti-fuse elements are destroyed, a mean current value of the destroyed elements Xt (μA) is the sum total of currents X (μA) flowing through an N umber of anti-fuse elements. Therefore, we have $$Xt(\mu A) = X(\mu A) \times P \quad (1)$$

The standard deviation σt of the current values is expressed $$\sigma t^2 = \sigma t 0^2 + \sigma t 1^2 + \ldots + \sigma t (P-1)^2 \quad (2)$$

$$\sigma t = \sqrt{P} \times \sigma(\mu A)$$

From those expressions, we see that where the P number of anti-fuse elements are used, the mean value is increased to be P times of the mean value, but its standard deviation is increased to be not P times, but $\sqrt{P}$ times.

In the instant embodiment, to distinctly distinguish between "0" and "1", it is preferred that a difference of "1" from "0" is as large as possible. When the mean value reaches Xt, the standard deviation curve is gentle, but it is desirable that the range of ±3σ is sufficiently distanced form the "0".

It is assumed that two anti-fuse elements are used, and that the current mean value X of the destroyed anti-fuse elements is 100 μA, X=100 μA, and the standard deviation σ of the current values is 30 μA, σ=30 μA. It is assumed that a sense amplifier circuit is capable of recognizing 10 μA or larger of the current as "1".

In a case where one anti-fuse element is destroyed on the assumptions just mentioned, a current value I that is out of the range of ±3σ is $$I = 100\mu A \pm 3 \times 30\mu A$$

I<10μA or I>190 μA

With intention of distinguishing between "0" and "1", a range of I>190 μA is closest to the best condition. Actually, 1.5% of the current values are recognized to be defective.

In a case where two anti-fuse elements are used, the mean current Xt=100 μA×2=200 μA, and the standard deviation σ2=√2×30 μA=42 μA.

Similarly, $$I = 200\mu A \pm 3 \times 42\mu A$$

I<74μA or I>326μA

From this, it is seen that a large margin of 64 μA is present to 10 μA, which is the threshold current of the sense amplifier. Conversely, the current values of 10 μA or larger are given below in terms of the standard deviation, $$(200\mu A - 10\mu A)/42\mu A = 4.5\sigma$$

That is, where two anti-fuse elements are used, the products may be used as conforming products, in the range to 4.5σ. Incidentally, while ±3.0σ has about 67000 PPM, ±4.5σ has a probability of about 2000 PPM. From this, it is statistically clear that the defective percent is remarkably reduced.

Next, size impact of the memory circuit using more than two anti-fuse elements in the present embodiment will be described.

The memory circuit using two anti-fuse elements has an increased area when compared with the conventional memory circuit using one anti-fuse element, and the increased area may be considered to be an area A enclosed by a dotted line in FIG. 1.

Let us consider a case of realizing an anti-fuse memory circuit having a memory capacity of 64 bits shown in FIG. 6A and another anti-fuse memory circuit having a memory capacity of 1 Kbits shown in FIG. 6B. Each memory circuit will be described in two forms, one using one anti-fuse element and the other using two anti-fuse elements. In both the anti-fuse memory circuits, the sizes of the blocks of a power source part 51, which includes the program voltage generating circuit 13 and the read voltage generating circuit 14, and a controller part 52, which includes the drive circuit 20, are equal to each other, but the sizes of blocks of anti-fuse parts (64 bits) 52 are greatly different from each other.

An area of the power source part 51 is: 360 μm (W direction)×290 μm (H direction)=104, 400 μm². An area of the controller part 52 is: 360 μm (W)×30 μm (H)=10,800 μm².

An area of the 1-bit memory circuit using one anti-fuse element is: 5.0 μm (W)×30 μm (H)×64 bit=10,800 μm². An area of the 64-bit memory circuit using one anti-fuse element is: 104,400 μm²+10,800 μm²+10,800 μm²=126,000 μm².

When securing an increase of 10 μm in the H direction, the area of the 1-bit memory circuit using two anti-fuse elements is: 5.0 μm (W)×40 μm (H)×64 bit×2=25,600 μm². The area of the 64-bit memory circuit using two anti-fuse elements is 140,800 μm². The area of the 64-bit memory circuit using two anti-fuse elements is increased by 11.8% when compared to that of the memory circuit using one anti-fuse element. An area of the 1-Kbit memory circuit using one anti-fuse element is 268,800 μm², and an area of the 1-Kbit memory circuit using two anti-fuse elements is 524,800 μm². The area of the 1-Kbit memory circuit using one anti-fuse element is increased by 95.2% when compared to that of the memory circuit using two anti-fuse elements.

As described above, impact to the overhead area of the periphery circuit varies depending on the number of bits of the anti-fuse memory circuit.

SECOND EMBODIMENT

Figure 7:
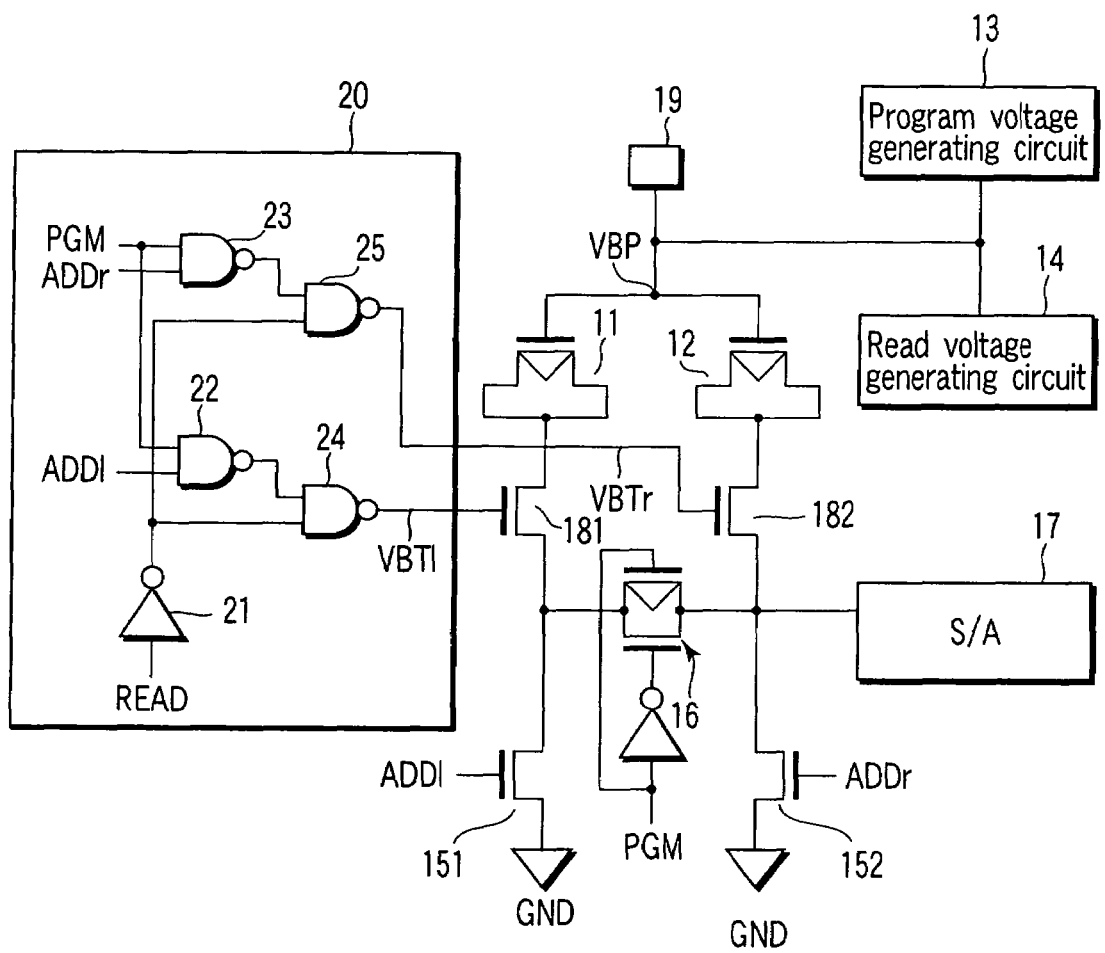
FIG. 7 is a circuit diagram showing an anti-fuse memory circuit according to a second embodiment of the invention.

In the first embodiment, if necessary, an external pad 19 may be connected to the gate common connection node VBP between the anti-fuse elements 11 and 12, as shown in FIG. 7, in order to monitor operation of the anti-fuse memory circuit by applying the programming voltage or the readout voltage to the common connection node of the first ends, or the gates, of the two anti-fuse elements 11 and 12, from exterior.

THIRD EMBODIMENT

Figure 8:
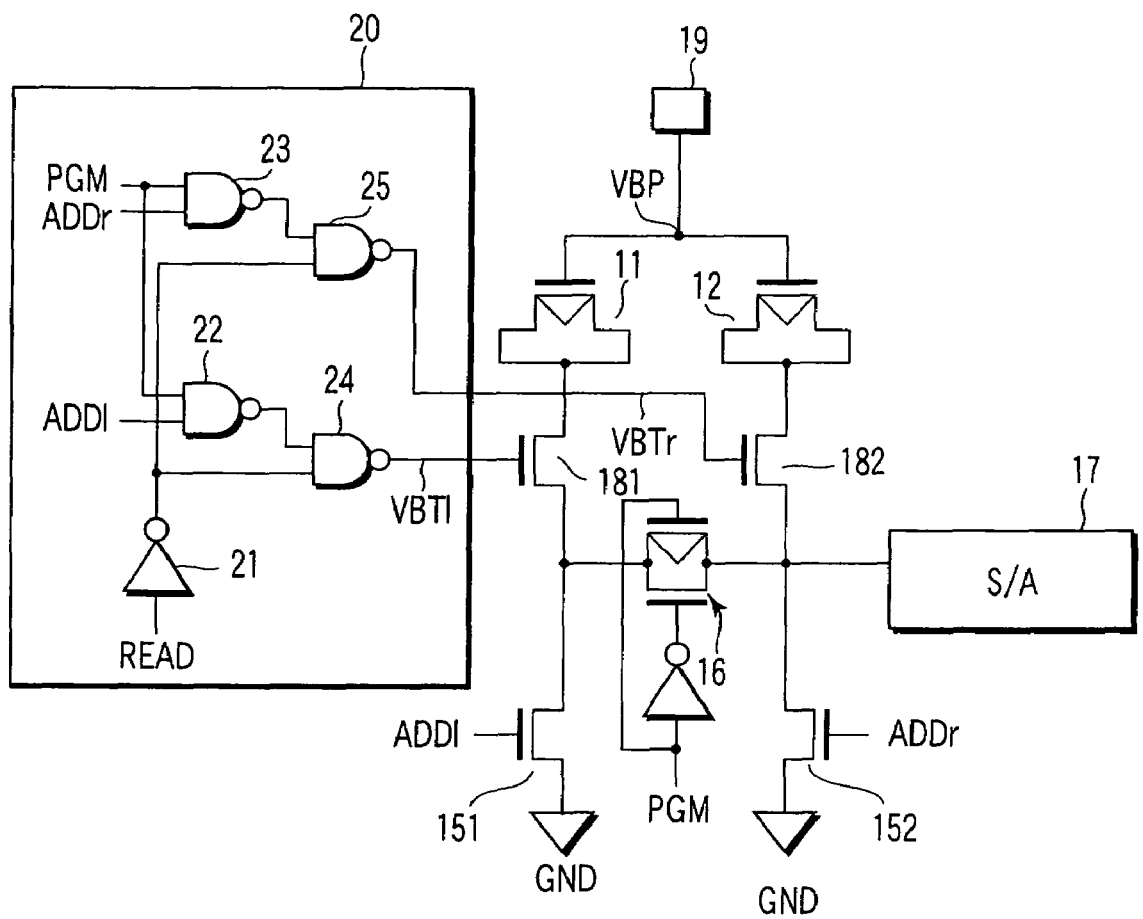
FIG. 8 is a circuit diagram showing an anti-fuse memory circuit according to a third embodiment of the invention.

In the first embodiment, the program voltage generating circuit 13 and the read voltage generating circuit 14 are formed in the semiconductor integrated circuit. In a third embodiment of the invention, as shown in FIG. 8, the program voltage generating circuit and the read voltage generating circuit are omitted. In place of those circuits, an external pad 19, which is provide for voltage application and monitoring, is connected to the gate common connection node VBP of the anti-fuse elements 11 and 12. The programming voltage and the readout voltage are generated by an external tester and applied to the external pad 19. When high programming voltage is applied to the external pad 19, some measure, for example, a protection measure against electrostatic surge destroy, must be taken.

FOURTH EMBODIMENT

In each of the first to third embodiments, the CMOS transfer gate 16 is connected to the first ends of the first and the second NMOS transistors 151 and 152, and the sense amplifier 17 is connected to the node of the first end of the CMOS transfer gate 16. If necessary, the CMOS transfer gate 16 may be omitted, and the connection position of the sense amplifier 17 may be changed to another.

Figure 9:
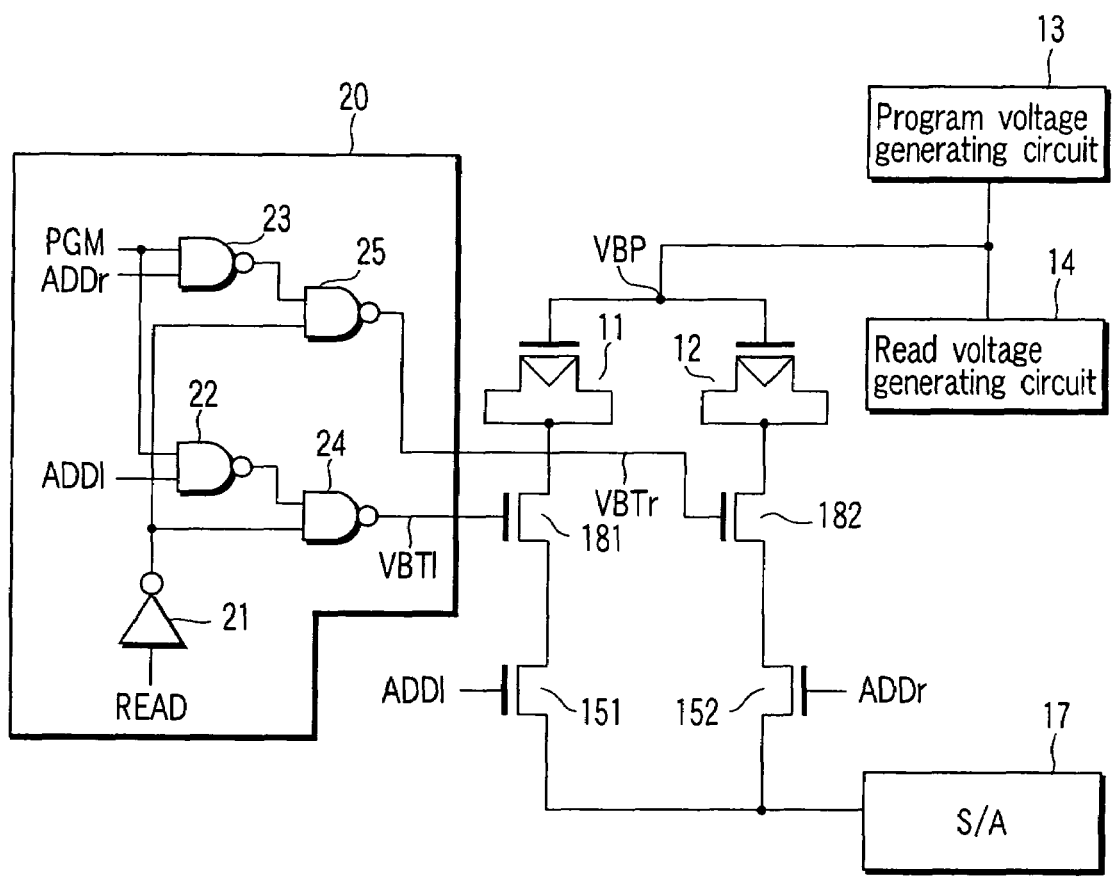
FIG. 9 is a circuit diagram showing an anti-fuse memory circuit according to a fourth embodiment of the invention.

FIG. 9 shows an anti-fuse memory circuit according to a fourth embodiment of the invention. The anti-fuse memory circuit uses a plurality of anti-fuse elements, in this embodiment, two anti-fuse elements, for storing 1-bit data. The anti-fuse memory circuit of FIG. 9 is different from the anti-fuse memory circuit of FIG. 1 in the following points.
a) The CMOS transfer gate 16 is omitted.
b) The source-drain current path of the third NMOS transistor 181 and the source-drain current path of the first NMOS transistor 151 are connected in series to between the second end of the first anti-fuse element 11 and the sense node of the sense amplifier 17.
c) The source-drain current path of the fourth NMOS transistor 182 and the source-drain current path of the second NMOS transistor 152 are connected in series to between the second end of the second anti-fuse element 12 and the sense node of the sense amplifier 17.
d) The first and the second NMOS transistors 151 and 152 are in an on state during a data readout period.
e) The sense amplifier 17 is connected at the input terminal to the sense node. In a programming mode, the input terminal of the sense amplifier 17 is set at reference potential, e.g., ground potential. In a data readout mode, it senses data of "1" or "0" output from the anti-fuse elements.

Operation of the anti-fuse memory circuit shown in FIG. 9 is basically the same as of the anti-fuse memory circuit of FIG. 1. In the FIG. 9 circuit, the first and the second NMOS transistors 151 and 152 are connected to between the anti-fuse elements 11 and 12 and the input terminal of the sense amplifier 17. With such a circuit connection, in a data readout mode, the on-resistors of the NMOS transistors 151 and 152 are connected in series to between the anti-fuse elements 11 and 12 and the input terminal of the sense amplifier 17. Accordingly, the present embodiment is desirably used when the readout voltage from the anti-fuse element is higher than that of the anti-fuse memory circuit in FIG. 1.

Also in the anti-fuse memory circuit of the fourth embodiment, the external pad 19 may be connected to the node VBP or the program voltage generating circuit and the read voltage generating circuit may be omitted, as in the second and the third embodiments.

Further, also in the anti-fuse memory circuit of the fourth embodiment, the voltage separation arrangement may be provided between the output terminal of the program voltage generating circuit 13 and the output terminal of the read voltage generating circuit 14, as shown in FIGS. 4 and 5.

FIFTH EMBODIMENT

In the first to fourth embodiments thus far described, voltage separation is carried out by using two NMOS transistors for program select in order to apply the destructive programming voltage individually to each of the two anti-fuse elements during the programming period. A fifth embodiment includes a fuse array in which a plurality of anti-fuse elements is arrayed in matrix. To program, specific anti-fuse elements are selected from those elements during the programming period.

Figure 10:
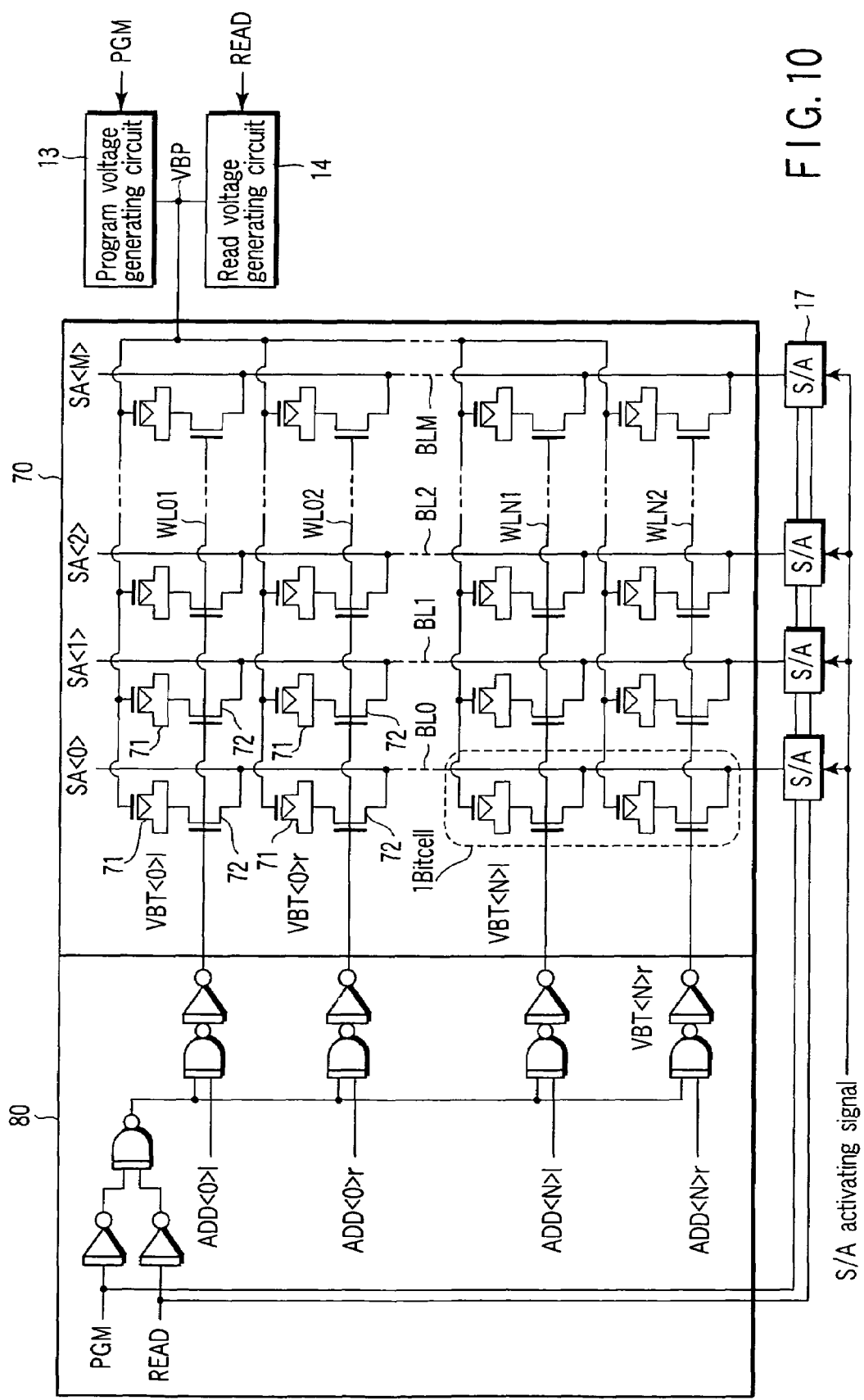
FIG. 10 is a circuit diagram showing an anti-fuse memory circuit according to a fifth embodiment of the invention.

FIG. 10 shows an anti-fuse memory circuit of the fifth embodiment. In FIG. 10, a fuse array 70 contains unit circuits, which are arrayed in a matrix of 2N rows×M columns (N and M are each a natural number). Each unit circuit contains an anti-fuse element 71 and an NMOS transistor 72 for select, which are connected in series such that a second end of the anti-fuse element 71 is connected to a first end of the NMOS transistors 72. The first ends, or gates, of anti-fuse elements 71 are connected commonly to the node VBP, i.e., the output terminals of the program voltage generating circuit 13 and the read voltage generating circuit 14. The gates of the NMOS transistors 72 in the unit circuits arranged in the same row are connected commonly to a word line WLi of those word lines WLi (i=01, 02, . . . N1, N2), which corresponds to the row. Further, the second ends of the NMOS transistors 72 in the unit circuits arranged in the same row are connected commonly to a bit line BLj of those bit lines BLj (j=1, 2, . . . M), which corresponds to the column. Those bit lines BLj are connected to the input terminals of sense amplifiers 17, respectively. In the embodiment, two unit circuits, which belong to the same column and to adjacent two rows, form a 1-bit memory circuit (1-bit cell).

The input terminal of each sense amplifier 17 is set at a reference potential, for example, the ground potential during the programming period. The sense amplifier 17 senses data of "0" or "1" read out from two anti-fuse elements during the readout period. The plurality of sense amplifiers 17 are selectively driven by sense amplifier energizing signals (S/A energizing signals), which are generated according to an address signal.

A word-line drive circuit 80 selects a pair of the word lines WLi (two word lines) according to the program mode signal PGM, the readout mode signal READ, and the address signal ADD<0>1, ADD<0>r, . . . , ADD<N>1, ADD<N>r, and selectively drives the select NMOS transistors 72 of each unit circuit connected to the selected word lines. The word-line drive circuit 80 successively turns on the two select NMOS transistors 72 in a 1-bit memory circuit selected during the programming period so that as described above, the 1-bit memory circuit is formed by the two unit circuits, which belong to the same column and the two rows being adjacent to each other. During the readout period, the word-line drive circuit concurrently turns on the two select NMOS transistors 72 in the 1-bit memory circuit selected.

The anti-fuse memory circuit of the fifth embodiment programs by individually selecting the anti-fuse elements 71 in the fuse array 70 containing the plurality of anti-fuse elements 71 arrayed in matrix, during the programming period. With this, like the first embodiment, the instant embodiment presents a clear difference between a destructive state and a nondestructive state of the anti-fuse element, and hence stably distinguishes between them by using two anti-fuse elements to store 1-bit data.

Also in the anti-fuse memory circuit of the fifth embodiment, the external pad 19 may be connected to the node VBP or the program voltage generating circuit and the read voltage generating circuit may be omitted, as in the second and the third embodiments.

Further, also in the anti-fuse memory circuit of the fifth embodiment, the voltage separation arrangement may be provided between the output terminal of the program voltage generating circuit 13 and the output terminal of the read voltage generating circuit 14, as shown in FIGS. 4 and 5.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An anti-fuse memory circuit comprising:
   first and second anti-fuse elements each having first and second ends, the first ends thereof being interconnected;
   a program voltage generating circuit which generates a programming voltage during a programming period to program the first and second anti-fuse elements, and applies the programming voltage to a common connection node of the first ends of the first and second anti-fuse elements;
   a read voltage generating circuit which generates a readout voltage during a readout period to read out data from the first and second anti-fuse elements, and applies the readout voltage to the common connection node of the first ends of the first and second anti-fuse elements;
   a first transistor being turned on by a first select signal during the programming period, a current path of the first transistor being connected to between the second end of the first anti-fuse element and a reference potential node;
   a second transistor having a current path thereof being connected to between the second end of the second anti-fuse element and the reference potential node, the second transistor being turned on by a second select signal during the programming period;
   a switch element which is connected to the first ends of the first and second transistors being interconnected, the switch element being put in an off state during the programming period and in an off state during the readout period; and
   a sense amplifier which is connected at an input terminal to the first end of the switch element, the sense amplifier being sensed data read out from the first and second anti-fuse elements.

2. The anti-fuse memory circuit according to claim 1, wherein the first and second anti-fuse elements are each a MOS transistor having a gate, a source and a drain, the source and the drain thereof are shortcircuited, and the gate is the first end, and the source and the drain being shortcircuited is the second end.

3. The anti-fuse memory circuit according to claim 1, further comprising:

a third transistor having a current path which is inserted between the second end of the first anti-fuse element and the first transistor;
   a fourth transistor having a current path which is inserted between the second end of the second anti-fuse element and the second transistor; and
   a drive circuit which outputs first and second drive signals to turn on the third transistor when the first anti-fuse element is programmed, turn on the fourth transistor when the second anti-fuse element is programmed, and to concurrently turn on the third and fourth transistors during the readout period.

4. The anti-fuse memory circuit according to claim 1, wherein the first transistor is a first NMOS transistor having a gate which receives the first select signal, and
   the second transistor is a second NMOS transistor having a gate which receives the second select signal.

5. The anti-fuse memory circuit according to claim 3, wherein the third transistor is a third NMOS transistor having a gate which receives the first drive signal, and
   the fourth transistor is a fourth NMOS transistor having a gate which receives the second drive signal.

6. The anti-fuse memory circuit according to claim 3, wherein the drive circuit includes:
   an inverter circuit which receives a readout mode signal enabled during the readout period;
   a first NAND circuit which receives a program mode signal enabled in the readout period and the first select signal;
   a second NAND circuit which receives the program mode signal and the second select signal;
   a third NAND circuit which receives the output signals from the first NAND circuit and the inverter circuit and outputs the first drive signal; and
   a fourth NAND circuit which receives the output signals of the second NAND circuit and the inverter circuit and outputs the second drive signal.

7. The anti-fuse memory circuit according to claim 1, further comprising an external terminal which is connected to the first end common connection node of the first and second anti-fuse elements, to supply a programming voltage or a readout voltage each applied from exterior.

8. The anti-fuse memory circuit according to claim 1, further comprising a diode element connected between an output terminal of the read voltage generating circuit and the first common connection node of the first and second anti-fuse elements.

9. An anti-fuse memory circuit comprising:
   first and second anti-fuse elements each having first and second ends, the first ends thereof being interconnected;
   a program voltage generating circuit which generates a programming voltage during a programming period to program the first and second anti-fuse elements, and applies the programming voltage to a common connection node of the first ends of the first and second anti-fuse elements;
   a read voltage generating circuit which generates a readout voltage during a readout period to read out data from the first and second anti-fuse elements, and applies the readout voltage to the common connection node of the first ends of the first and second anti-fuse elements;
   a first transistor having a current path which is coupled at a first end to the second end of the first anti-fuse element, the first transistor being controlled by a first select signal;

a second transistor having a current path which is coupled at a first end to the second end of the second anti-fuse element, and at a second end of the second transistor to a second end of the current path of the first transistor, the second transistor being controlled by a second select signal; and a sense amplifier which is connected at an input terminal to the second end common connection node of the first and second transistors, the sense amplifier being sensed data read out from the first and second anti-fuse elements.

10. The anti-fuse memory circuit according to claim 9, wherein the first and second anti-fuse elements are each a MOS transistor having a gate, a source and a drain, the source and the drain thereof are shortcircuited, and the gate is the first end, and the source and the drain being shortcircuited is the second end.

11. The anti-fuse memory circuit according to claim 9, further comprising:

a third transistor having a current path which is inserted between the second end of the first anti-fuse element and the first transistor;

a fourth transistor having a current path which is inserted between the second end of the second anti-fuse element and the first end of the current path of the second transistor; and a drive circuit which outputs first and second drive signals to turn on the third transistor during a programming period of the first anti-fuse element, turn on the fourth transistor during the programming period of the second anti-fuse element, and to concurrently turn on the third and fourth transistors during the readout period.

12. The anti-fuse memory circuit according to claim 9, wherein the first transistor is a first NMOS transistor having a gate which receives the first select signal, and the second transistor is a second NMOS transistor having a gate which receives the second select signal.

13. The anti-fuse memory circuit according to claim 11, wherein the third transistor is a third NMOS transistor having a gate which receives the first drive signal, and the fourth transistor is a fourth NMOS transistor having a gate which receives the second drive signal.

14. The anti-fuse memory circuit according to claim 11, wherein the drive circuit includes:

an inverter circuit which receives a readout mode signal enabled during the readout period;

a first NAND circuit which receives a program mode signal enabled in the readout period and the first select signal;

a second NAND circuit which receives the program mode signal and the second select signal;

a third NAND circuit which receives the output signals from the first NAND circuit and the inverter circuit and outputs the first drive signal; and a fourth NAND circuit which receives the output signals of the second NAND circuit and the inverter circuit and outputs the second drive signal.

15. The anti-fuse memory circuit according to claim 9, further comprising an external terminal which is connected to the first end common connection node of the first and second anti-fuse elements, the external terminal to supply a programming voltage or a readout voltage each applied from exterior.

16. The anti-fuse memory circuit according to claim 9, further comprising a diode element connected between an output terminal of the read voltage generating circuit and the first common connection node of the first and second anti-fuse elements.

17. A anti-fuse memory circuit comprising:

a fuse array in which a plurality of unit circuits each containing an anti-fuse element having first and second ends, and a select transistor having first and second ends, and a gate, the first end of the select transistor thereof being connected to the second end of the anti-fuse element, the unit circuits being arrayed in matrix, the first ends of the anti-fuse elements in the fuse array commonly connected to each other, and each two unit circuits belonging to the same column and to two rows storing 1-bit data;

a program voltage generating circuit which generates a programming voltage during a programming period to program the fuse array, and applies the programming voltage to a common connection node of the first ends of the anti-fuse elements;

a read voltage generating circuit which generates a readout voltage during a readout period to read out data from the fuse array, and applies the readout voltage to the common connection node of the first ends of the anti-fuse elements;

a plurality of word lines which is provided corresponding to the respective rows of the fuse array, each word line being connected commonly to the gates of the select transistors of the unit circuits belonging to the same row;

a plurality of bit lines which is provided corresponding to the respective columns of the fuse array, each bit line being connected commonly to the second ends of the select transistors of the unit circuits belonging to the same column;

a word-line drive circuit which successively drives two word lines selected from said plurality of word lines during a programming period to program the fuse array, and concurrently drives two word lines selected from said plurality of word lines during the readout period to read out data from the fuse array; and a plurality of sense amplifiers having input terminals which are connected to said plurality of bit lines, each of said plurality of sense amplifiers being set at a reference potential during the programming period to program the fuse array, and during the readout period to read out data from the fuse array, the sense amplifiers being selectively driven according to address signals to sense data from the bit lines.

18. The anti-fuse memory circuit according to claim 17, wherein the anti-fuse elements are each a MOS transistor having a gate, a source and a drain, the source and the drain thereof are shortcircuited, and the gate is the first end, and the source and the drain being shortcircuited is the second end.

19. The anti-fuse memory circuit according to claim 17, further comprising an external terminal which is connected to the first end common connection node of the anti-fuse elements, to supply a programming voltage or a readout voltage each applied from exterior.

20. The anti-fuse memory circuit according to claim 17, further comprising a diode element connected between an output terminal of the read voltage generating circuit and the first common connection node of the anti-fuse elements.

* * * * *